(12) United States Patent
Choi et al.

(10) Patent No.: US 8,877,533 B2
(45) Date of Patent: Nov. 4, 2014

(54) METHOD OF MANUFACTURING OXIDE THIN FILM TRANSISTOR AND DISPLAY DEVICE

(71) Applicant: LG Display Co., Ltd., Seoul (KR)

(72) Inventors: Kyechul Choi, Seoul (KR); Bong Chul Kim, Daegu (KR); Chan Ki Ha, Incheon (KR); Sang Moo Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/682,822

(22) Filed: Nov. 21, 2012

(65) Prior Publication Data

US 2013/0130421 A1   May 23, 2013

(30) Foreign Application Priority Data

Nov. 22, 2011   (KR) .................. 10-2011-0122248

(51) Int. Cl.
| | |
|---|---|
| *H01L 21/00* | (2006.01) |
| *H01L 29/66* | (2006.01) |
| *H01L 29/786* | (2006.01) |
| *H01L 33/00* | (2010.01) |
| *H01L 21/02* | (2006.01) |

(52) U.S. Cl.
CPC ...... *H01L 29/66742* (2013.01); *H01L 29/7869* (2013.01); *H01L 21/02565* (2013.01); *H01L 33/005* (2013.01); *H01L 21/0262* (2013.01); *H01L 21/02554* (2013.01)
USPC ............... 438/34; 438/30; 438/104; 438/150; 438/151; 438/155

(58) Field of Classification Search
None
See application file for complete search history.

(56) References Cited

U.S. PATENT DOCUMENTS

| | | | | |
|---|---|---|---|---|
| 5,989,944 | A  * | 11/1999 | Yoon | 438/149 |
| 2008/0123044 | A1 * | 5/2008 | Oh et al. | 349/187 |
| 2008/0197350 | A1 | 8/2008 | Park et al. | |
| 2009/0283763 | A1 * | 11/2009 | Park et al. | 257/43 |
| 2010/0055832 | A1 | 3/2010 | Akimoto et al. | |
| 2010/0059745 | A1 * | 3/2010 | Yoon et al. | 257/43 |
| 2011/0141100 | A1 | 6/2011 | Park et al. | |
| 2011/0291089 | A1 | 12/2011 | Akimoto et al. | |

FOREIGN PATENT DOCUMENTS

| | | |
|---|---|---|
| KR | 20080076608 A | 8/2008 |
| KR | 100857455 B1 | 9/2008 |
| KR | 20110098993 A | 9/2011 |

OTHER PUBLICATIONS

Office Action dated Jan. 29, 2014, issued by the Korean Intellectual Property Office in Korean Patent Application No. 10-2011-0122248.

* cited by examiner

*Primary Examiner* — Kyoung Lee
(74) *Attorney, Agent, or Firm* — Morgan, Lewis & Bockius LLP

(57) ABSTRACT

A method of manufacturing oxide thin film transistor and display device are provided. In the method of manufacturing an oxide thin film transistor, the method includes: forming an active layer of an oxide semiconductor on a substrate, and performing surface treatment with plasma for the active layer to permeate oxygen into the active layer.

12 Claims, 10 Drawing Sheets

METHOD OF MANUFACTURING OXIDE THIN FILM TRANSISTOR AND DISPLAY DEVICE

CROSS REFERENCE TO RELATED APPLICATION(S)

This application claims the benefit under 35 U.S.C. §119(a) of Korean Patent Application No. 10-2011-0122248, filed on Nov. 22, 2011, the entire disclosure of which is incorporated by reference herein for all purposes.

BACKGROUND

1. Technical Field

The present disclosure relates to an oxide thin film transistor, and more particularly, to a method of manufacturing an oxide thin film transistor, in which an oxide thin film transistor having improved performance is manufactured through surface treatment of an active layer made of an oxide semiconductor.

2. Discussion of the Related Art

A liquid crystal display device of flat panel display devices is a device that displays an image by using optical anisotropy of a liquid crystal, and is used for a notebook computer, a desktop monitor, etc.

The liquid crystal display device includes a color filter substrate, a thin film transistor substrate, and a liquid crystal layer interposed between the color filter substrate and the thin film transistor substrate.

An active matrix mode which is a driving mode used for the liquid crystal display device uses an amorphous silicon thin film transistor as a switching element.

The amorphous silicon thin film transistor used for the aforementioned liquid crystal display device may be manufactured by a low temperature process but has very small mobility. On the other hand, although a polycrystalline silicon thin film transistor has high mobility, problems occur in that it is difficult to obtain a large area due to difficulty in obtaining uniform properties and a high temperature process is required.

In this respect, an oxide thin film transistor in which an active layer is formed of an oxide semiconductor has been developed.

FIG. 1 is a cross-sectional view illustrating a structure of a general oxide thin film transistor according to a related art.

As shown in FIG. 1, the general oxide thin film transistor includes a gate electrode 21 formed on a substrate 10, a gate insulating film 22 formed on the gate electrode 21, an active layer 30 formed of an oxide semiconductor on the gate insulating film 22, source and drain electrodes 41 and 42 electrically connected with a predetermined region of the active layer 30, a passivation film 50 formed on the source and drain electrodes 41 and 42, and a pixel electrode 70 electrically connected with the drain electrode 42.

Generally, the active layer 30 formed of an oxide semiconductor is formed in such a manner that an oxide semiconductor layer is deposited on the gate insulating film 22 by sputtering and then selectively patterned using a photolithography process.

According to the related art, as oxygen density in a reaction gas is controlled during the sputtering process for forming the oxide semiconductor layer, carrier density of the active layer is controlled, whereby switching element properties of the oxide semiconductor may be obtained.

At this time, properties as a switching element of the active layer made of an oxide semiconductor and uniformity of element properties in a glass and between glasses or lots due to oxygen density change are determined by the oxygen density control.

However, since improving conditions of the sputtering process for deposition of the oxide semiconductor is limited, a problem occurs in that it is difficult to improve performance and uniformity of the active layer.

SUMMARY

Embodiments of the present invention relate to a method of manufacturing oxide thin film transistor and display device. Accordingly, embodiments of the present invention are directed to a method of manufacturing an oxide thin film transistor and a display device, which substantially obviate one or more problems due to limitations and disadvantages of the related art.

An object is to provide a method of manufacturing an oxide thin film transistor, in which oxygen is permeated into an active layer made of an oxide semiconductor by using plasma containing oxygen, to improve uniformity of oxygen density.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided a method of manufacturing an oxide thin film transistor comprises the steps of forming an active layer of an oxide semiconductor on a substrate, and performing surface treatment with plasma for the active layer to permeate oxygen into the active layer.

In another aspect, there is provided a method of manufacturing a display device, the display device comprising an oxide thin film transistor, the method including: forming an active layer of an oxide semiconductor on a substrate, and performing surface treatment with plasma for the active layer to permeate oxygen into the active layer.

It is to be understood that both the foregoing general description and the following detailed description are examples and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
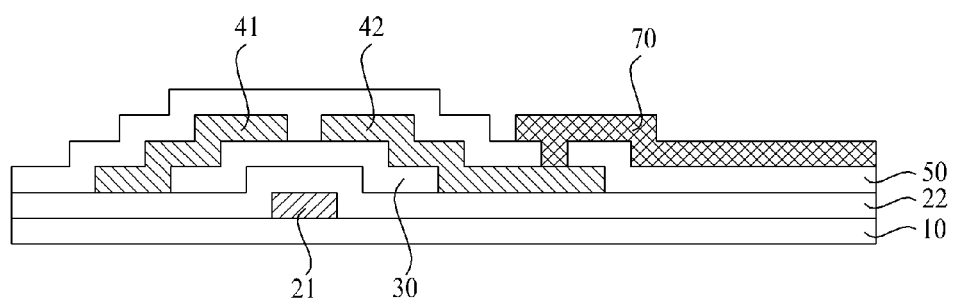
FIG. 1 is a cross-sectional view illustrating a structure of a general oxide thin film transistor according to a related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In description of embodiments of the present invention, when a structure is described as being positioned "on or above" or "under or below" another structure, this description should be construed as including a case in which the structures contact each other as well as a case in which a third structure is disposed therebetween.

Figure 2:
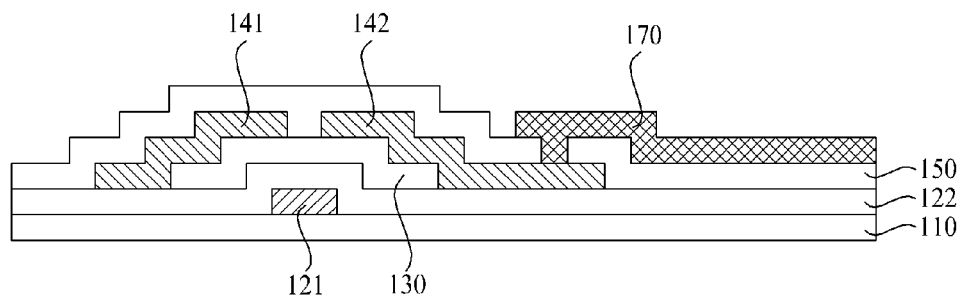
FIG. 2 is a cross-sectional view illustrating a structure of an oxide thin film transistor according to an example embodiment.

FIG. 2 is a cross-sectional view illustrating a structure of an oxide thin film transistor according to an example embodiment.

As shown in FIG. 2, the oxide thin film transistor according to an example embodiment may include a gate electrode 121 formed on a predetermined substrate 110, a gate insulating film 122 formed on the gate electrode 121, an active layer 130 formed, e.g., of an amorphous zinc oxide semiconductor on the gate insulating film 122, source and drain electrodes 141 and 142 electrically connected with a predetermined region of the active layer 130, a passivation film 150 formed on the source and drain electrodes 141 and 142, and a pixel electrode 170 electrically connected with the drain electrode 142 on the passivation film 150.

At this time, according to an example embodiment, surface treatment on the active layer 130 by using plasma containing oxygen may be performed before forming the source and drain electrodes 141 and 142, and uniformity of oxygen in the active layer of a large area may be increased.

Also, surface treatment may be performed for the active layer 130 by using plasma containing fluorine together with oxygen, and the active layer 130 may further include fluorine.

FIGS. 3a to 3f are cross-sectional views illustrating a method of manufacturing an oxide thin film transistor according to an example embodiment, and relate to a process of manufacturing the aforementioned oxide thin film transistor shown in the FIG. 2 example.

Figure 3A:
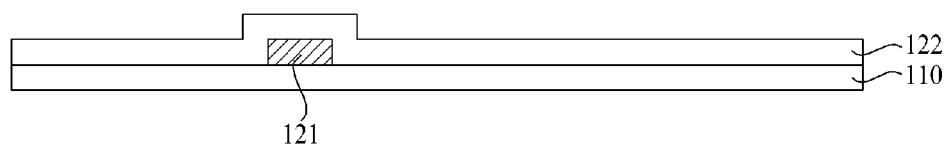
FIGS. 3a to 3f are cross-sectional views illustrating a method of manufacturing an oxide thin film transistor according to an example embodiment.

First of all, as shown in FIG. 3a, after the predetermined gate electrode 121 is formed on the substrate 110, the gate insulating film 122 may be formed on the entire surface of the substrate 110 including the gate electrode 121.

The gate electrode 121 may be formed in such a manner that a predetermined metal material may be deposited on the substrate 110, and a photoresist may be deposited on the predetermined metal material and then patterned using a mask process in which exposure, development and etching processes may be performed sequentially using a mask. Hereinafter, patterning for each element which will be described later may be performed using the aforementioned mask process.

Meanwhile, although not shown, a gate line connected with the gate electrode 121 may be formed simultaneously when the gate electrode 121 is formed.

The gate insulating film 122 may be formed using a plasma enhanced chemical vapor deposition (PECVD) process.

Figure 3B:
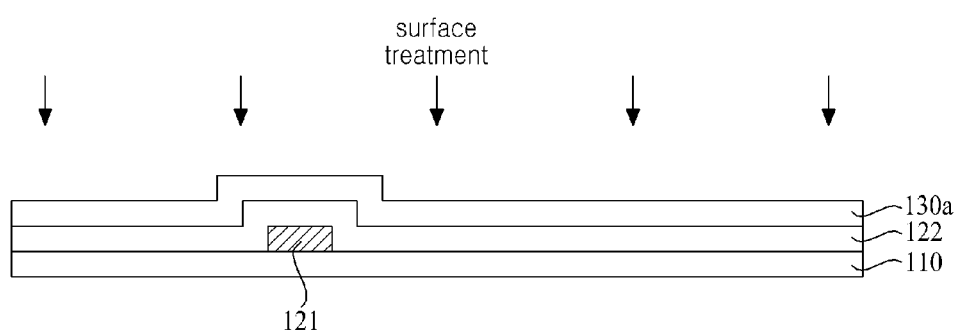

Next, as shown in FIG. 3b, the oxide semiconductor may be deposited on the substrate 110 on which the gate insulating film 122 is formed, to form an oxide semiconductor layer 130a.

The oxide semiconductor layer 130a may be formed by sputtering.

Afterwards, surface treatment with plasma containing oxygen may be performed for the oxide semiconductor layer 130a.

The surface treatment with plasma containing oxygen may be performed using any one of Plasma Enhanced Chemical Vapor Deposition (PECVD), Plasma Etching, and Enhanced Capacitively Coupled Plasma.

Since the Plasma Etching and the Enhanced Capacitively Coupled Plasma may be performed using the existing Dry Etching equipment, the equipment developing cost may be reduced.

The plasma enhanced chemical vapor deposition (PECVD) may be performed, for example, under conditions of Power of 2 K-10 K, pressure of 1-1.5 Torr, and $N_2O$ gas of 10,000-100,000 sccm (Standard Cubic Centimeter Per Minute), for 5-150 sec.

The Plasma Etching may be performed, for example, under conditions of Power of 5 K-25 K, Pressure of 200-350 mTorr, and $O_2$ atmosphere, for 5-180 sec.

The Enhanced Capacitively Coupled Plasma may be performed, for example, under conditions of Power of 2 K-13 K (Source) and 0 K-13 K (Bias), Pressure of 20-150 mTorr, and $O_2$ atmosphere, for 5-150 sec.

The surface treatment with plasma may be performed using plasma further containing fluorine.

The surface treatment with plasma further containing fluorine may be performed using either Plasma Etching or Enhanced Capacitively Coupled Plasma.

The Plasma Etching may be performed, for example, under conditions of Power of 5 K-25 K, Pressure of 200-350 mTorr, and atmosphere of $SF_6$ or $CF_4:O_2$ having a ratio of 1:1-1:20, for 5-180 sec.

The Enhanced Capacitively Coupled Plasma may be performed, for example, under conditions of Power of 2 K-13 K (Source) and 0 K-13 K (Bias), Pressure of 20-150 mTorr, and atmosphere of $SF_6$ or $CF_4:O_2$ having a ratio of 1:1-1:20, for 5-150 sec.

Figure 3C:
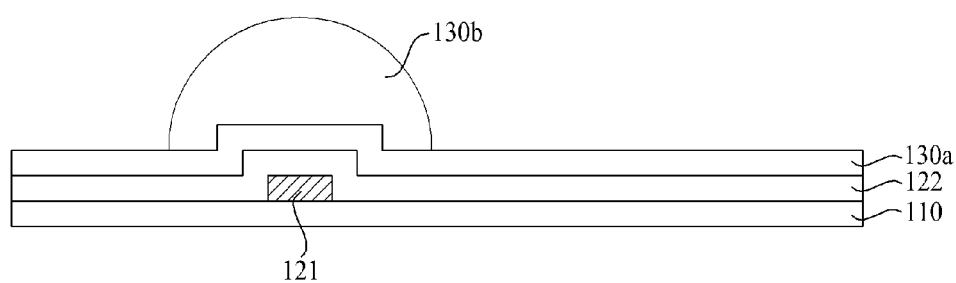

Next, as shown in FIG. 3c, a predetermined photoresist pattern 130b may be formed on the surface-treated oxide semiconductor layer 130a.

Figure 3D:
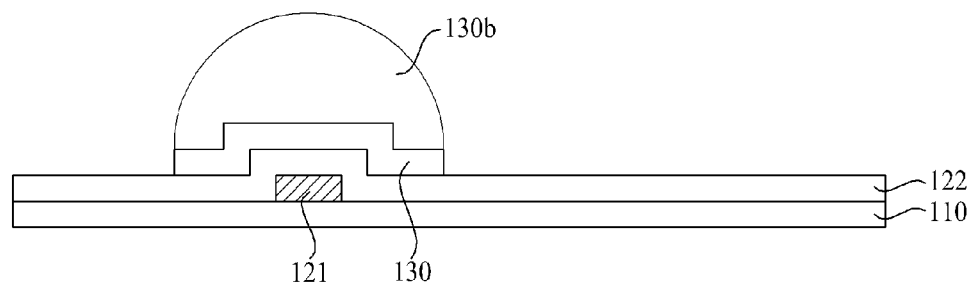

Then, as shown in the FIG. 3d example, the oxide semiconductor layer 130a may be wet-etched using the photoresist pattern 130b as a mask to form the active layer 130.

Figure 3E:
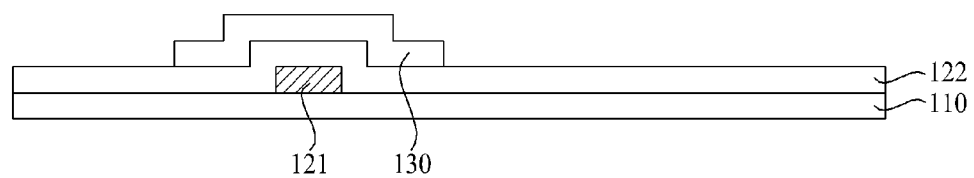

Next, as shown in FIG. 3e, the photoresist pattern 130b may be removed, e.g., by wet-strip.

Figure 3F:
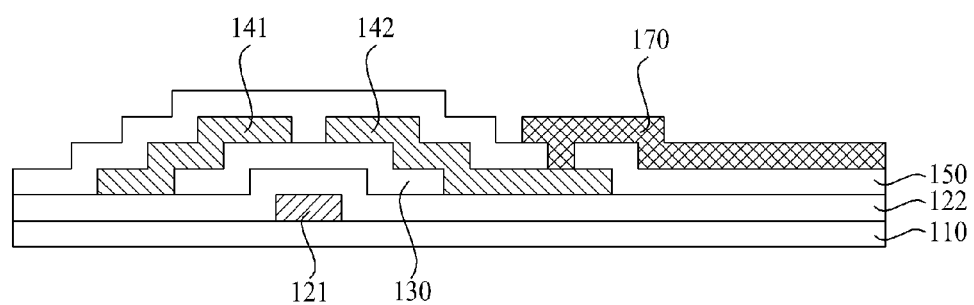

Next, as shown in FIG. 3f, the source electrode 141 and the drain electrode 142 spaced apart from the source electrode 141 may be formed on the active layer 130.

Afterwards, the passivation film 150 may be formed on the source electrode 141 and the drain electrode 142 to have a contact hole that partially exposes the drain electrode 142.

Afterwards, the pixel electrode 170 electrically connected with the drain electrode 142 may be formed through the contact hole.

FIGS. 4a to 4e are cross-sectional views illustrating a method of manufacturing an oxide thin film transistor according to an example embodiment, and relate to a process of manufacturing the aforementioned oxide thin film transistor shown in the FIG. 2 example. Hereinafter, the repeated description of the same elements as those of the aforementioned examples will be omitted.

Figure 4A:
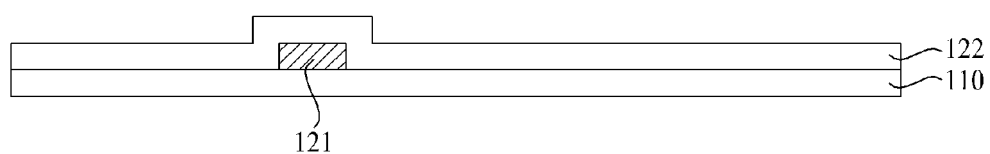
FIGS. 4a to 4e are cross-sectional views illustrating a method of manufacturing an oxide thin film transistor according to an example embodiment.

First of all, as shown in FIG. 4a, after the predetermined gate electrode 121 is formed on the substrate 110, the gate insulating film 122 may be formed on the entire surface of the substrate 110 including the gate electrode 121.

Figure 4B:
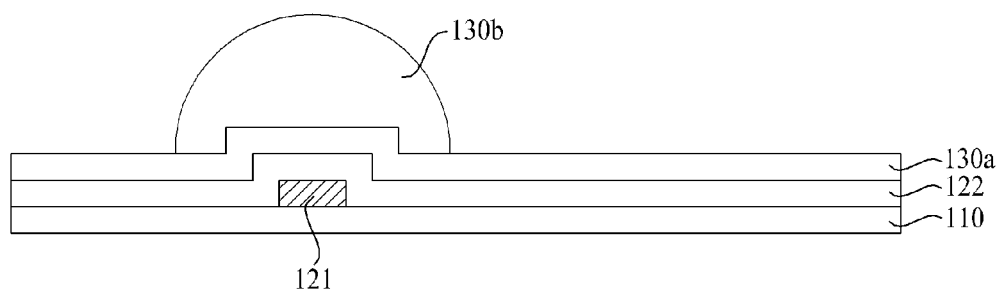

Next, as shown in FIG. 4b, the oxide semiconductor may be deposited on the substrate 110 on which the gate insulating film 122 is formed, to form an oxide semiconductor layer 130a.

Afterwards, a predetermined photoresist pattern 130b may be formed on the oxide semiconductor layer 130a.

Figure 4C:
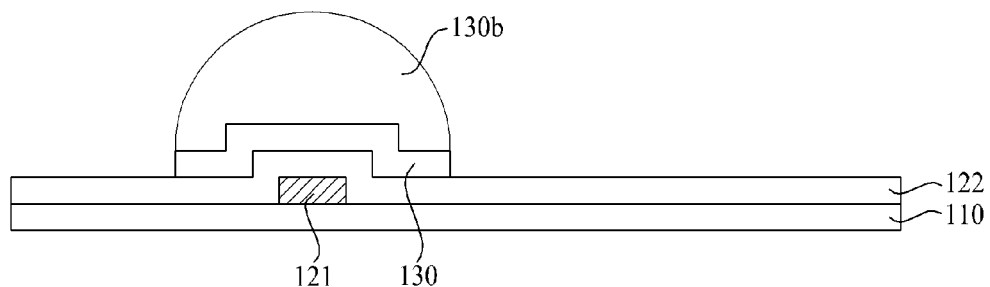

Then, as shown in FIG. 4c example, the oxide semiconductor layer 130a may be wet-etched using the photoresist pattern 130b as a mask to form the active layer 130.

Figure 4D:
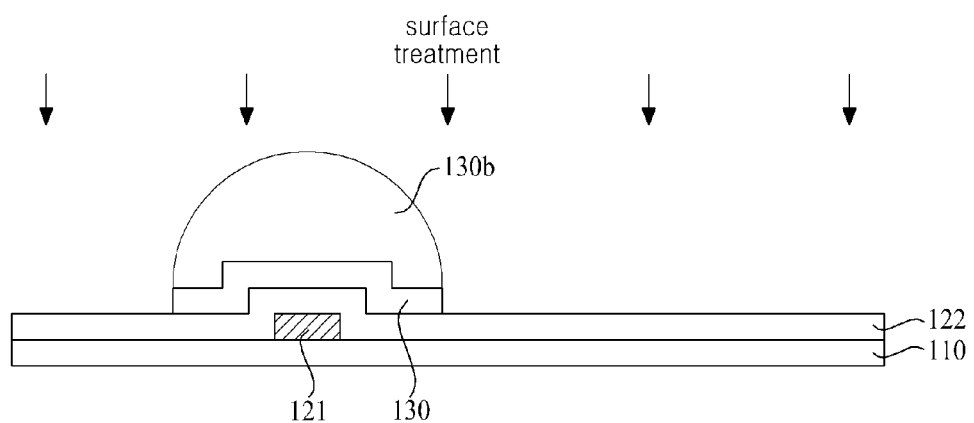

Next, as shown in FIG. 4d, the photoresist pattern 130b may be subjected to, e.g., dry-strip and at the same time surface treatment, e.g., with plasma containing oxygen, may be performed for the active layer 130.

The surface treatment with plasma may be performed using plasma further containing fluorine.

Figure 4E:
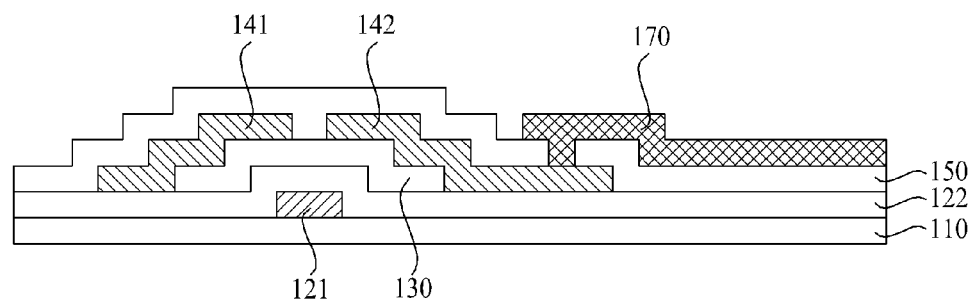

Next, as shown in FIG. 4e, the remaining photoresist pattern 130b may be fully removed, e.g., by wet-strip.

Afterwards, the source electrode 141 and the drain electrode 142 spaced apart from the source electrode 141 may be formed on the surface-treated active layer 130.

Afterwards, the passivation film 150 may be formed on the source electrode 141 and the drain electrode 142 to have a contact hole that partially exposes the drain electrode 142.

Afterwards, the pixel electrode 170 electrically connected with the drain electrode 142 may be formed through the contact hole.

FIGS. 5a to 5e are cross-sectional views illustrating a method of manufacturing an oxide thin film transistor according to an example embodiment, and relate to a process of manufacturing the aforementioned oxide thin film transistor shown in the FIG. 2 example. Hereinafter, the repeated description of the same elements as those of the aforementioned examples will be omitted.

Figure 5A:
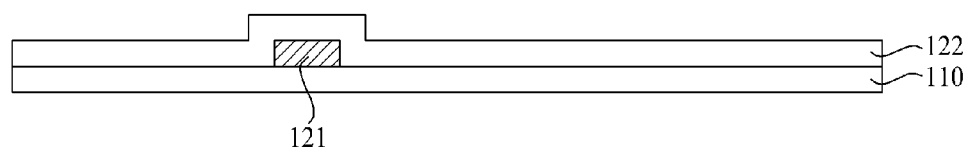
FIGS. 5a to 5e are cross-sectional views illustrating a method of manufacturing an oxide thin film transistor according to an example embodiment.

First of all, as shown in FIG. 5a, after the predetermined gate electrode 121 is formed on the substrate 110, the gate insulating film 122 may be formed on the entire surface of the substrate 110 including the gate electrode 121.

Figure 5B:
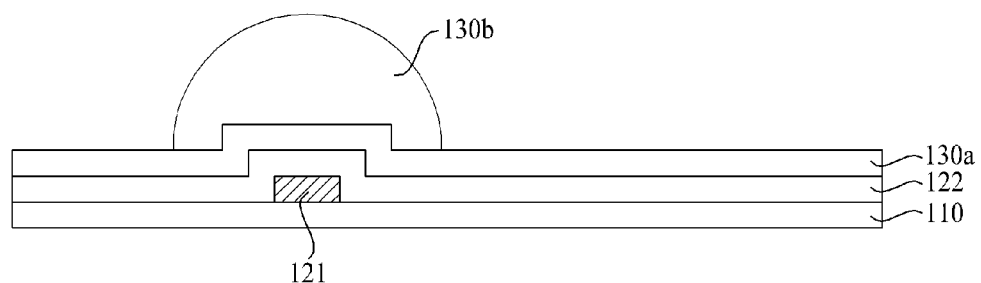

Next, as shown in FIG. 5b, the oxide semiconductor may be deposited on the substrate 110 on which the gate insulating film 122 is formed, to form an oxide semiconductor layer 130a.

Afterwards, a predetermined photoresist pattern 130b may be formed on the oxide semiconductor layer 130a.

Figure 5C:
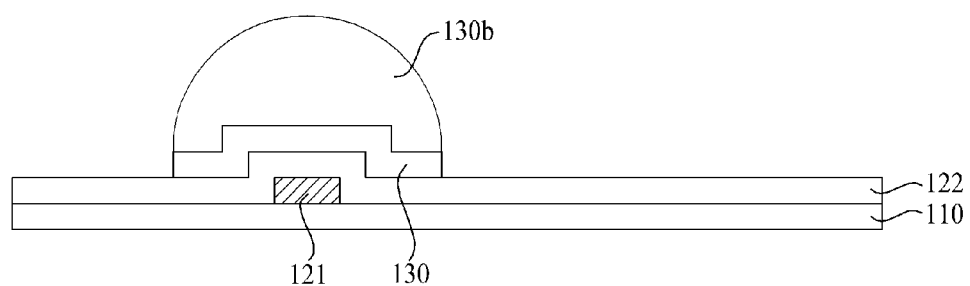

Then, as shown in FIG. 5c, the oxide semiconductor layer 130a may be, e.g., wet-etched using the photoresist pattern 130b as a mask to form the active layer 130.

Afterwards, the photoresist pattern 130b may be removed by, e.g., wet-strip.

Figure 5D:
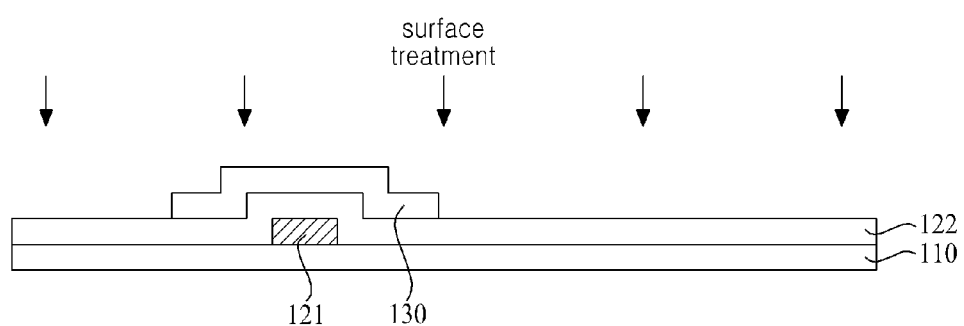

Next, as shown in FIG. 5d, surface treatment, e.g., with plasma containing oxygen, may be performed for the active layer 130.

The surface treatment with plasma may be performed using plasma further containing fluorine.

Figure 5E:
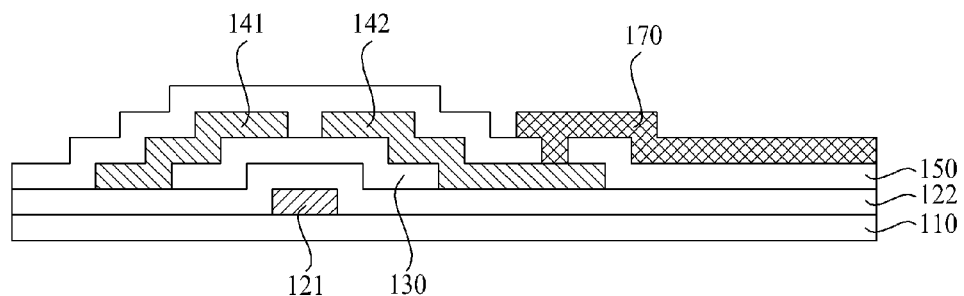

Next, as shown in FIG. 5e, the source electrode 141 and the drain electrode 142 spaced apart from the source electrode 141 may be formed on the surface-treated active layer 130.

Afterwards, the passivation film 150 may be formed on the source electrode 141 and the drain electrode 142 to have a contact hole that partially exposes the drain electrode 142.

Afterwards, the pixel electrode 170 electrically connected with the drain electrode 142 may be formed through the contact hole.

FIGS. 6a to 6d are cross-sectional views illustrating a method of manufacturing an oxide thin film transistor according to an example embodiment, and relate to a process of manufacturing the aforementioned oxide thin film transistor shown in the FIG. 2 example. Hereinafter, the repeated description of the same elements as those of the aforementioned examples will be omitted.

Figure 6A:
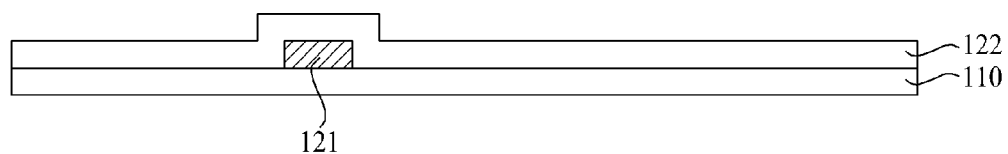
FIGS. 6a to 6d are cross-sectional views illustrating a method of manufacturing an oxide thin film transistor according to an example embodiment.

First of all, as shown in FIG. 6a, after the predetermined gate electrode 121 is formed on the substrate 110, the gate insulating film 122 may be formed on the entire surface of the substrate 110 including the gate electrode 121.

Figure 6B:
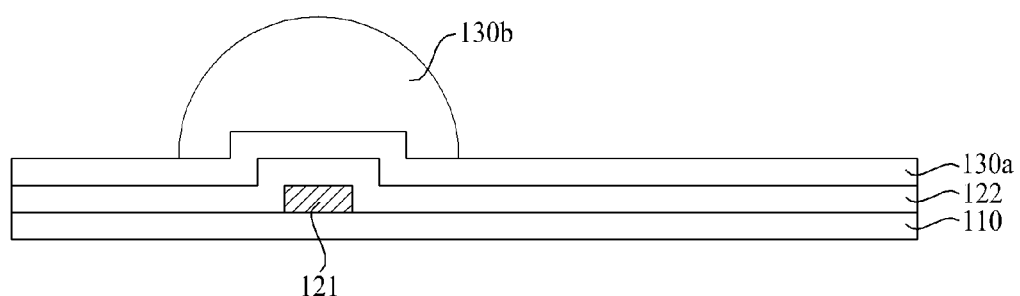

Next, as shown in FIG. 6b, the oxide semiconductor may be deposited on the substrate 110 on which the gate insulating film 122 is formed, to form an oxide semiconductor layer 130a.

Afterwards, a predetermined photoresist pattern 130b may be formed on the oxide semiconductor layer 130a.

Figure 6C:
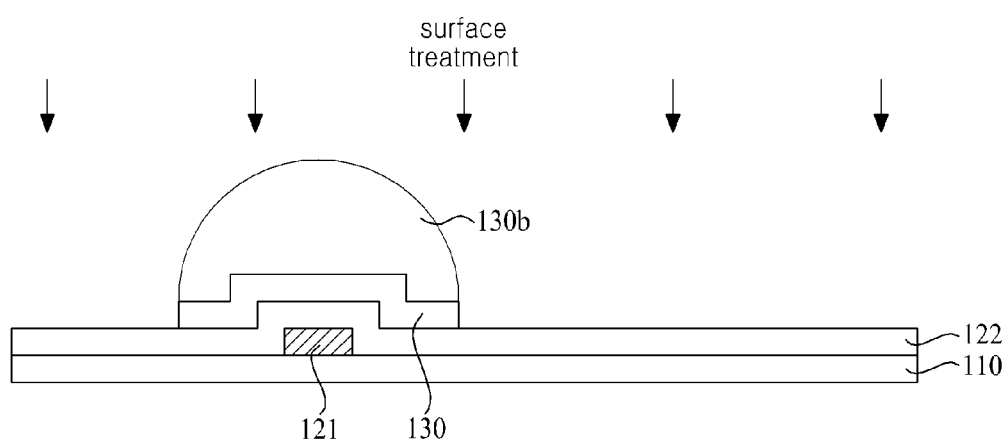

Then, as shown in FIG. 6c, the oxide semiconductor layer 130a may be, e.g., wet-etched using the photoresist pattern 130b as a mask to form the active layer 130.

Afterwards, the photoresist pattern 130b may be subjected, e.g., to dry-strip and at the same time surface treatment with plasma containing oxygen may be performed for the active layer 130.

The surface treatment with plasma may be performed using plasma further containing fluorine.

Figure 6D:
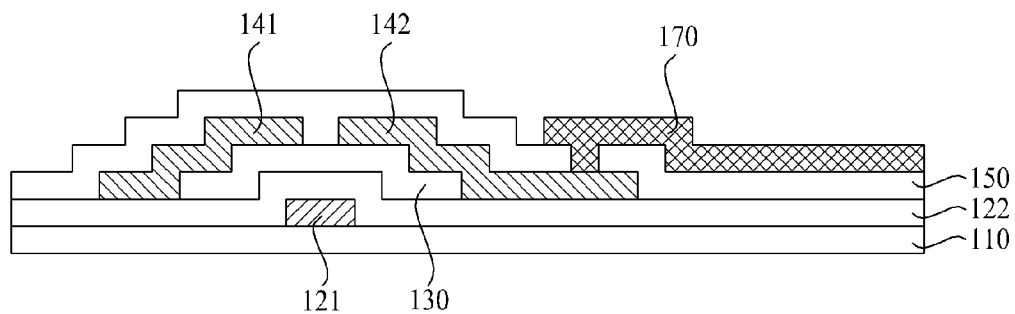

Next, as shown in FIG. 6d, the source electrode 141 and the drain electrode 142 spaced apart from the source electrode 141 may be formed on the surface-treated active layer 130.

Afterwards, the passivation film 150 may be formed on the source electrode 141 and the drain electrode 142 to have a contact hole that partially exposes the drain electrode 142.

Afterwards, the pixel electrode 170 electrically connected with the drain electrode 142 may be formed through the contact hole.

Figure 7A:
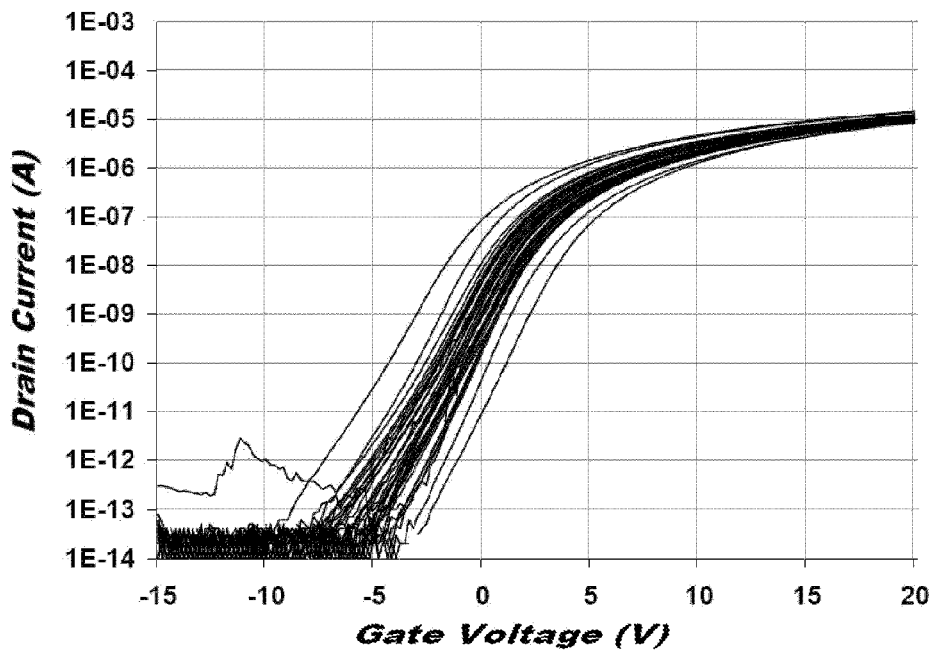
FIGS. 7a and 7b are graphs illustrating a comparison of transfer properties of an oxide thin film transistor according to the related art and an example embodiment.
Figure 7B:
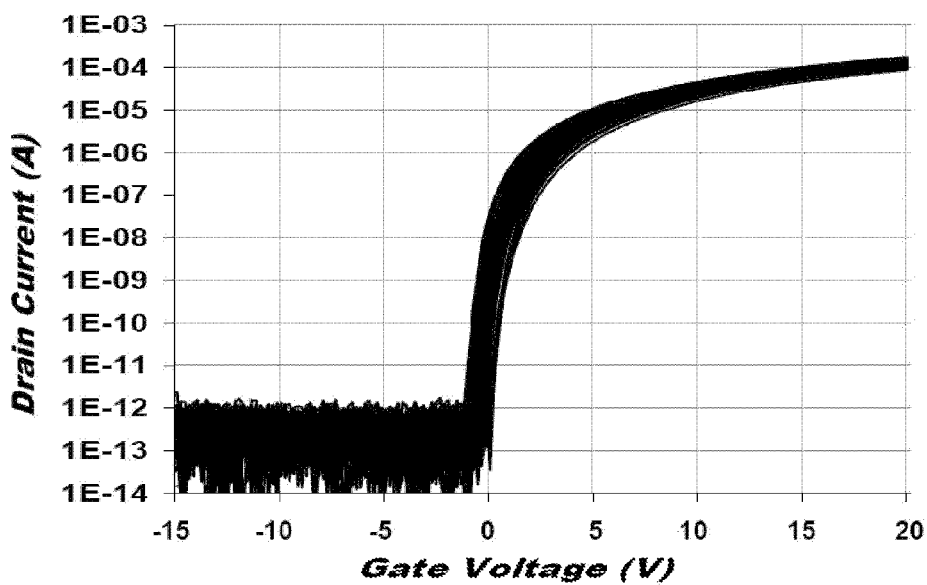

FIGS. 7a and 7b are graphs illustrating the measured results of transfer properties of an oxide thin film transistor at various arrangements on a glass of 2200 mm×2500 mm.

FIG. 7a relates to an oxide thin film transistor according to the related art. FIG. 7b relates to an oxide thin film transistor according to an example embodiment.

As is apparent from FIG. 7a, the oxide thin film transistor according to the related art has a slower slope of a transfer curve and a lower on-current than the oxide thin film transistor according to an example embodiment.

Also, in the oxide thin film transistor according to the related art, measured transfer properties are not uniform depending on the arrangement of the glass. As a result, it is noted that obtaining uniform oxygen density in the oxide semiconductor layer during a sputtering process is limited.

By contrast, as shown in FIG. 7b, in the oxide thin film transistor according to an example embodiment, it is noted that a slope of a transfer curve may be steep and on-current may be been improved, and transfer properties may be improved. It is also noted that transfer properties based on the arrangement of the glass may be uniform and thus element uniformity may be improved.

This is because that uniformity of oxygen density in the active layer in the glass and between glasses or lots may be improved by surface treatment with plasma containing oxygen.

Also, it is noted that on-current may be improved as electric conductivity has been increased by fluorine injected into the active layer through surface treatment with plasma further containing fluorine.

Although the thin film transistor of a bottom gate structure in which the gate electrode is formed below the active layer has been described above, embodiments include a thin film transistor of a top gate structure in which the gate electrode is formed on the active layer.

Also, embodiments may be used for various known display devices, which are manufactured using a thin film transistor, for example, an organic light emitting diode display device in which an organic light emitting diode is connected to a driving transistor, as well as a liquid crystal display device.

The respective elements described above may be used using various materials known in the art. Hereinafter, a material of each element will be described as examples, but embodiments are not limited thereto.

The gate electrode 121, the source electrode 141 and the drain electrode 142 may be made, e.g., of Mo, Al, Cr, Au, Ti, Ni, Nd, Cu, or their alloy(s), and may be made of a single layer of the metal or alloy(s) or multiple layers, including more than double layers.

The gate insulating film 122 and the passivation film 150 may be made of an inorganic material such as $SiO_x$ and $SiN_x$, or of an organic material such as bisbenzocyclobutene (BCB) and photoacryl.

The active layer 130 may be made of an amorphous Zinc Oxide (ZnO) based semiconductor, and may be made of amorphous indium gallium zinc oxide (a-IGZO) semiconductor in which heavy metal such as In and Ga is contained in the amorphous ZnO based semiconductor.

The pixel electrode 170 may be made of a transparent conductive material such as Indium Tin Oxide (ITO), Indium Zinc Oxide (IZO), and ZnO.

As described above, according to example embodiments, the following advantages may be obtained. According to example embodiments, as uniformity of oxygen density in the active layer made of the oxide semiconductor is improved, uniformity in the glass and between glasses or lots may be obtained. In addition, according to example embodiments, as fluorine is injected into the active layer made of the oxide semiconductor, electric conductivity may be improved.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing an oxide thin film transistor, the method comprising:
   forming an active layer of an oxide semiconductor on a substrate; and
   performing surface treatment with plasma for the active layer to permeate oxygen into the active layer,
   wherein the performing surface treatment with plasma is performed using one of: Plasma Enhanced Chemical Vapor Deposition, Plasma Etching, and Enhanced Capacitively Coupled Plasma,
   wherein the forming an active layer comprises:
      forming an oxide semiconductor layer on the substrate,
      forming a photoresist pattern on the oxide semiconductor layer,
      etching the oxide semiconductor layer by using the photoresist pattern, and
   wherein the performing surface treatment with plasma is performed between the forming the oxide semiconductor layer and the forming the photoresist pattern.

2. The method of claim 1, wherein the performing surface treatment with plasma comprises further permeating fluorine into the active layer.

3. The method of claim 1, further comprising:
   forming a gate electrode on the substrate;
   forming a gate insulating film on the gate electrode;
   forming a source electrode and a drain electrode on the active layer, the drain electrode being spaced apart from the source electrode;
   forming a passivation film on the source electrode and the drain electrode, the passivation film having a contact hole that partially exposes the drain electrode; and
   forming a pixel electrode electrically connected with the drain electrode through the contact hole.

4. A method of manufacturing an oxide thin film transistor, the method comprising:
   forming an active layer of an oxide semiconductor on a substrate;
   performing surface treatment with plasma for the active layer to permeate oxygen into the active layer,
   wherein the performing surface treatment with plasma is performed using one of: Plasma Enhanced Chemical Vapor Deposition, Plasma Etching, and Enhanced Capacitively Coupled Plasma,
   wherein the forming an active layer comprises:
      forming an oxide semiconductor layer on the substrate,
      forming a photoresist pattern on the oxide semiconductor layer, and
      etching the oxide semiconductor layer by using the photoresist pattern, and
   wherein the performing surface treatment with plasma is performed after the etching the oxide semiconductor layer;
   further comprising:
      dry stripping the photoresist pattern after the etching the oxide semiconductor layer,
      wherein the performing surface treatment with plasma is performed simultaneously with the dry stripping the photoresist pattern.

5. The method of claim 4, further comprising wet stripping the photoresist pattern after the performing surface treatment with plasma.

6. A method of manufacturing an oxide thin film transistor, the method comprising:
- forming an active layer of an oxide semiconductor on a substrate;
- performing surface treatment with plasma for the active layer to permeate oxygen into the active layer,
- wherein the performing surface treatment with plasma is performed using one of: Plasma Enhanced Chemical Vapor Deposition, Plasma Etching, and Enhanced Capacitively Coupled Plasma,
- wherein the forming an active layer comprises:
  - forming an oxide semiconductor layer on the substrate,
  - forming a photoresist pattern on the oxide semiconductor layer, and
  - etching the oxide semiconductor layer by using the photoresist pattern, and
- wherein the performing surface treatment with plasma is performed after the etching the oxide semiconductor layer;
- further comprising:
  - wet stripping the photoresist pattern after the etching the oxide semiconductor layer,
  - wherein the performing surface treatment with plasma is performed after the wet stripping the photoresist pattern.

7. A method of manufacturing a display device, the display device comprising an oxide thin film transistor, the method comprising:
- forming an active layer of an oxide semiconductor on a substrate; and
- performing surface treatment with plasma for the active layer to permeate oxygen into the active layer,
- wherein the performing surface treatment with plasma is performed using one of: Plasma Enhanced Chemical Vapor Deposition, Plasma Etching, and Enhanced Capacitively Coupled Plasma, and
- wherein the forming an active layer comprises:
  - forming an oxide semiconductor layer on the substrate,
  - forming a photoresist pattern on the oxide semiconductor layer, and
  - etching the oxide semiconductor layer by using the photoresist pattern, and
- wherein the performing surface treatment with plasma is performed between the forming the oxide semiconductor layer and the forming the photoresist pattern.

8. The method of claim 7, wherein the performing surface treatment with plasma comprises further permeating fluorine into the active layer.

9. The method of claim 7, further comprising:
- forming a gate electrode on the substrate;
- forming a gate insulating film on the gate electrode;
- forming a source electrode and a drain electrode on the active layer, the drain electrode being spaced apart from the source electrode;
- forming a passivation film on the source electrode and the drain electrode, the passivation film having a contact hole that partially exposes the drain electrode; and
- forming a pixel electrode electrically connected with the drain electrode through the contact hole.

10. A method of manufacturing a display device, the display device comprising an oxide thin film transistor, the method comprising:
- forming an active layer of an oxide semiconductor on a substrate; and
- performing surface treatment with plasma for the active layer to permeate oxygen into the active layer,
- wherein the performing surface treatment with plasma is performed using one of: Plasma Enhanced Chemical Vapor Deposition, Plasma Etching, and Enhanced Capacitively Coupled Plasma,
- wherein the forming an active layer comprises:
  - forming an oxide semiconductor layer on the substrate
  - forming a photoresist pattern on the oxide semiconductor layer, and
  - etching the oxide semiconductor layer by using the photoresist pattern, and
- wherein the performing surface treatment with plasma is performed after the etching the oxide semiconductor layer;
- further comprising:
  - dry stripping the photoresist pattern after the etching the oxide semiconductor layer,
  - wherein the performing surface treatment with plasma is performed simultaneously with the dry stripping the photoresist pattern.

11. The method of claim 10, further comprising wet stripping the photoresist pattern after the performing surface treatment with plasma.

12. A method of manufacturing a display device, the display device comprising an oxide thin film transistor, the method comprising:
- forming an active layer of an oxide semiconductor on a substrate; and
- performing surface treatment with plasma for the active layer to permeate oxygen into the active layer,
- wherein the performing surface treatment with plasma is performed using one of: Plasma Enhanced Chemical Vapor Deposition, Plasma Etching, and Enhanced Capacitively Coupled Plasma,
- wherein the forming an active layer comprises:
  - forming an oxide semiconductor layer on the substrate,
  - forming a photoresist pattern on the oxide semiconductor layer, and
  - etching the oxide semiconductor layer by using the photoresist pattern, and
- wherein the performing surface treatment with plasma is performed after the etching the oxide semiconductor layer;
- further comprising:
  - wet stripping the photoresist pattern after the etching the oxide semiconductor layer,
  - wherein the performing surface treatment with plasma is performed after the wet stripping the photoresist pattern.

* * * * *